United States Patent [19]

Rao

[11] 4,328,510
[45] May 4, 1982

[54] HIGH DENSITY READ/WRITE MEMORY CELL

[75] Inventor: G. R. Mohan Rao, Houston, Tex.

[73] Assignee: Texas Instruments Incorporated, Dallas, Tex.

[21] Appl. No.: 625

[22] Filed: Jan. 2, 1979

[51] Int. Cl.³ .............................................. H01L 27/02
[52] U.S. Cl. ...................................... 357/41; 357/22; 357/23; 357/50; 357/51
[58] Field of Search ................... 357/23, 22, 51, 41, 357/50; 148/1.5

[56] References Cited

U.S. PATENT DOCUMENTS 4,053,915 10/1977 Cave ............................ 357/51

Primary Examiner—Edward J. Wojciechowicz
Attorney, Agent, or Firm—John G. Graham

[57] ABSTRACT

A semiconductor memory cell of the random access, read/write type includes a single combined storage capacitor and access transistor structure. The process for making the cell is compatible with the standard method of making N-channel silicon gate MOS integrated circuits. A thin epitaxial region is grown over an implanted isolating region and a heavily doped bit line in each cell area. A thin gate oxide over the epitaxial layer separates it from a metal address line. A very small cell size is provided.

9 Claims, 11 Drawing Figures

HIGH DENSITY READ/WRITE MEMORY CELL

BACKGROUND OF THE INVENTION

This invention relates to semiconductor memory devices and method of manufacture, and more particularly to a random access, read/write memory cell.

Semiconductor read/write memory cells are usually of the so-called one-transistor type as disclosed in my U.S. Pat. No. 4,055,444 or in pending application, Ser. No. 722,841, filed Sept. 13, 1976, both assigned to Texas Instruments. While these cells have permitted densities as high as 64K bits on a chip less than 1/30 sq. inch in size, the demand for even smaller cell sizes and higher densities is continuing. The cost of a semiconductor memory device of a given chip size, in a package of a standard number of pins, is constant regardless of what is on the chip. Thus, if density can be increased, the cost per bit decreases.

It is the principal object of this invention to provide an improved semiconductor memory cell. Another object is to provide a read/write memory of reduced cell size. An additional object is to provide a dense array of RAM cells, made by a more efficient method.

SUMMARY OF THE INVENTION

In accordance with an illustrative embodiment of the invention, a semiconductor memory cell of the random access, read/write type includes a single combined storage capacitor and access transistor structure. The process for making the cell is compatible with the standard method of making N-channel silicon gate MOS integrated circuits. A thin epitaxial region is grown over an implanted isolating region and a heavily doped bit line in each cell area. A thin gate oxide over the epitaxial layer separates it from a metal address line. A very small cell size is provided.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
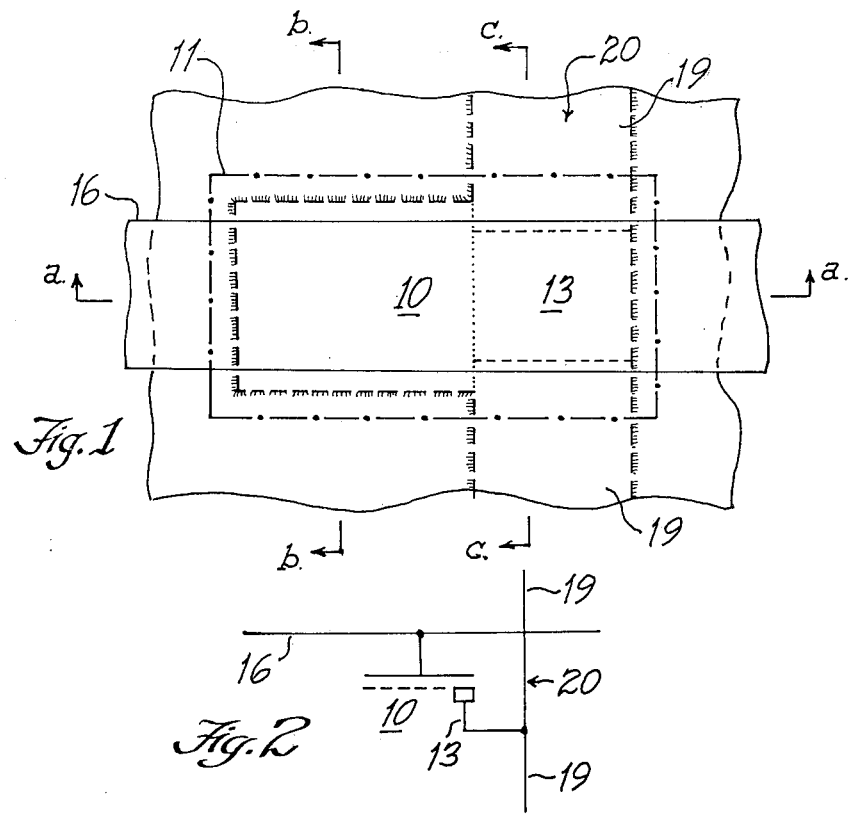
FIG. 1 is a greatly enlarged plan view of a small portion of a semiconductor chip showing the physical layout of one cell of memory array made according to the invention.
Figure 2:
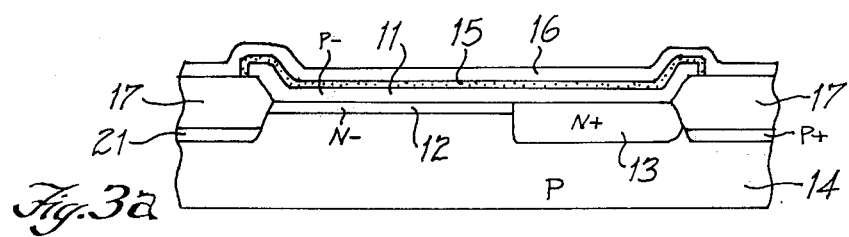
FIG. 2 is an electrical schematic diagram of the cell of FIG. 1.
Figures 3A, 3B, 3C:
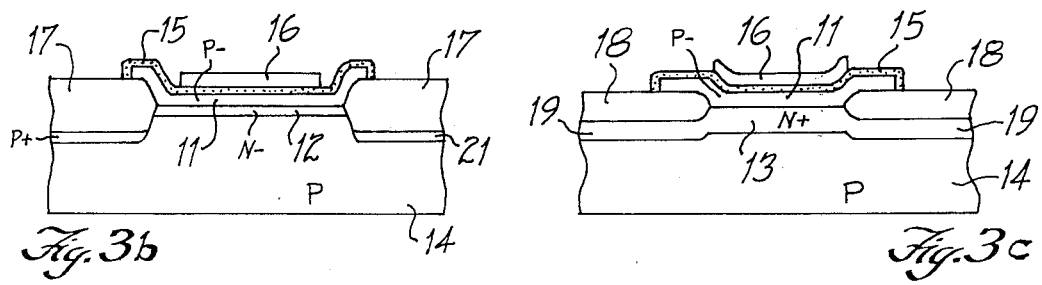
FIGS. 3a-3c are elevation views in section of the cell of FIG. 1, taken along the lines a—a, b—b, and c—c, respectively.

With reference to FIG. 1, a layout of one cell 10 of an array of read/write memory cells is shown greatly enlarged. The same cell 10 seen in FIG. 1 is shown in schematic diagram form in FIG. 2, using the same reference numerals and the same physical positions. More detail of the physical structure can be seen in the sectional views of FIGS. 3a-3c. Each cell 10 consists of a P-epitaxial layer 11 over a moat area which has an N-implanted isolating region 12 and a more heavily doped N+ bit line region 13, all in a P-substrate 14. Further, the cell includes a thin insulating coating 15 on the epitaxial silicon layer 11 and a metal word line 16. The insulating coating 15 is composed of silicon dioxide, or of silicon oxide with silicon nitride over it, and is perhaps 400 Å thick. The epitaxial layer 11 is about one to two microns thick. Thick field oxide 17 surrounds the cells, and thinner field oxide 18 overlies N+ regions 19 which complete the bit lines between cells. As seen in FIG. 2, each metal line 16 functions as an X or word address line, and the N+ regions 13 and 19 functions as a Y output or bit line 20. A channel stop P+ region 21 underlies the thick field oxide 17.

In operation, to write into a cell, a selected word line 16 is held at about +8 v, i.e., substantially above a logic 1 voltage of +5 v. This creates an inversion layer in the P-epitaxial region 11. To write a logic 0, the bit line 20 for the selected cell 10 is held at 0 v, so electrons will flow into the inversion layer and it will remain unchanged. To write a logic 1, the bit line 20 and thus the N+ region 13 for the selected cell is brought to +5 v, which will attract the electrons from the inversion layer; the inversion layer will therefore collapse. After a write cycle, the voltage on the word line 16 goes back down to +5 v for a store or maintain condition. The bit line 20 and thus the N+ region 13 is floating, exhibiting a high impedance to ground. If a logic 0 is stored, electrons in the P-layer 11 will be maintained. A logic 1 stored is a condition where no electrons are in the epi layer 11, i.e., it is depleted. The N- layer 12 functions to isolate the epi layer 11 from the substrate so charge will not leak; electrons will not enter the epi layer 11 from the substrate and cause loss of charge by recombinations. To read the bit stored, the word line 16 is brought to zero and the bit line precharged to 5 v. For "0" stored, the charge in the epi layer 11 will discharge into the N+ region 13 so the voltage on the bit line 20 will dip. If a logic 1 is stored, there is no negative charge to pull down the bit line voltage, so the bit line doesn't change when a 1 is read.

Turning now to FIGS. 4a-4c and 5a-5c, a process for making the cell array of the invention will be described. The starting material is a slice of P-type monocrystalline silicon, typically three or four inches in diameter and twenty mils thick, cut on the <100> plane, of a resistivity of about 6 to 8 ohm-cm. In the FIGURES the portion shown in the bar 14 represents only a very small part of the slice, less than one mil wide. After appropriate cleaning, the slice is oxidized by exposing to oxygen in a furnace at an elevated temperature of over 1000° C. to produce an oxide layer 31 over the entire slice of a thickness of about 1000 Å. Next, a layer 32 of silicon nitride of about 1000 Å thickness is formed over the entire slice by exposing to an atmosphere of dichlorsilane and ammonia in a reactor. A coating of photoresist is applied to the entire top surface of the slice, then exposed to ultraviolet light through a mask which defines the desired pattern of the thick field oxide 17 and the P+ channel stop 21. The resist is developed, leaving areas where nitride is then etched away by a nitride etchant, removing the exposed part of the nitride layer 32 but leaving in place the oxide layer 31; the nitride etchant does not react with the photoresist.

Using photoresist and nitride as a mask, the slice is now subjected to an ion implant step to produce the channel stop regions 21, whereby boron atoms are introduced into unmasked regions of silicon. The oxide layer 31 is left in place during the implant because it prevents the implanted boron atoms from out-diffusing from the surface during subsequent heat treatment. The boron implanted regions 33 do not exist in the same form in the finished device, because some of this part of the slice will have been consumed in the field oxidation procedure. Usually the slice would be subjected to a heat treatment after implant but prior to field oxide growth, as set forth in my U.S. Pat. No. 4,055,444, assigned to Texas Instruments.

Figures 4, 5:
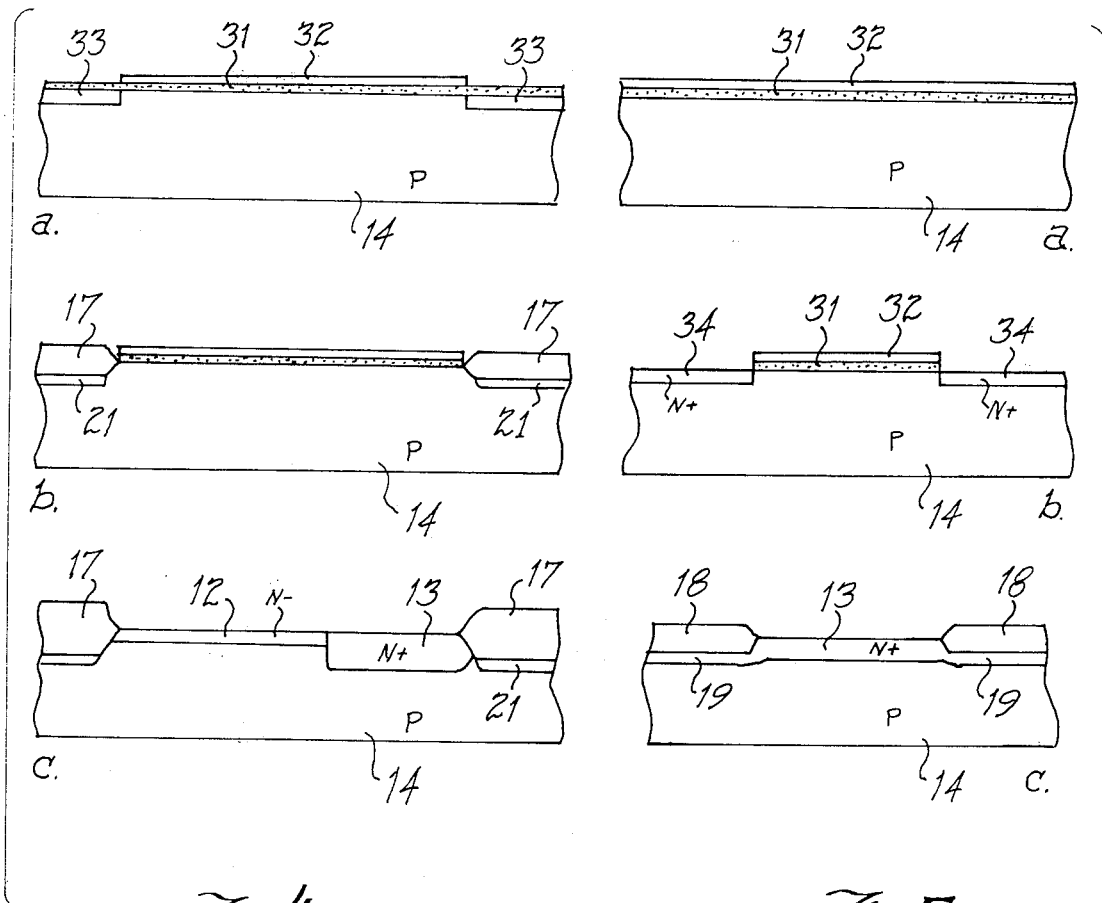
FIGS. 4a-4c, and 5a-5c are elevation views in section of the cell of FIGS. 1 and 3a-3c, at succesive stages in the manufacturing process, taken generally along the lines a—a and b—b in FIG. 1, respctively.

The next step in the process is the initial formation of field oxide 17, which is done by subjecting the slices to steam or an oxidizing atmosphere at about 1000° C. for several hours. This causes a thick field oxide region or layer 17 to be grown as seen in FIG. 4b. This region extends into the silicon surface because silicon is consumed as it oxidizes. The remaining parts of the nitride layer 32 mask oxidation. The thickness of this layer 17 is about 6000 Angstroms, about half of which is above the original surface and half below. The boron doped P+ regions 33 formed by implant will be partly consumed, but will also diffuse further into the silicon ahead of the oxidation front. Thus, P+ field stop regions 21 will result which will be much deeper than the original regions 33. At this point, the field oxide layer 17 is not nearly as thick as it will be in the finished device. Additional thickness results from subsequent heat treatments.

The slice is now coated with another photoresist layer and then exposed to ultraviolet light through a mask which defines the line 19 which is to be N+ diffused. After developing the photoresist, the slice is again subjected to etchants which remove the nitride now exposed by holes in the photoresist and the oxide exposed when nitride is removed, exposing bare silicon where the regions 19 are to be formed. As seen in FIG. 5b, a phosphorus diffusion produces N+ regions 34 which will subsequently become the regions 19. Instead of diffusion, these N+ regions 34 may be formed by ion implant, in which case the oxide layer 31 would be left in place and an anneal step used before the subsequent oxidation.

Referring to FIGS. 4c and 5c, a second field oxidation step is now performed by placing the slice in steam or dry oxygen at about 1000° C. for several hours. This oxidizes all of the top of the slice not covered by the remaining parts of the nitride layer 32, producing field oxide layer 18 which is about 5000 Å thickness. During this oxidation, the areas of field oxide 17 grow thicker, to perhaps 10,000 Å. The N+ regions 34 are partly consumed but also diffuse further into the silicon ahead of the oxidation front to create the heavily doped regions 19.

Next the remaining nitride layer 32 is removed by an etchant which attacks nitride but not silicon oxide. A light phosphorus implant is performed over the entire top surface of the slice to provide the isolating layer 12, then a photoresist mask is applied and a heavy phosphorous implant produces the N+ region 13 to form parts of the bit line 20. Then the oxide 31 is removed by etching and the exposed silicon cleaned. The epitaxial layer 11 is now grown by standard techniques; if polysilicon grows on top of the oxide 17 or 18 it is removed by etching. The gate oxide 15 is next grown by thermal oxidation to a thickness of about 400 Å. In areas of the slice where depletion load devices are required, although not pertinent to this invention, a masked ion implant step would be done before the epitaxial layer 11 is grown, or the threshold voltage of enhancement mode transistors in the periphery may be adjusted by ion implant. Also, windows for polysilicon to silicon contacts, if needed, are patterned and etched using photoresist before the polysilicon is grown.

A part of the upper surface of the epitaxial silicon layer 11 is oxidized by exposing the slice to an oxidizing atmosphere at 900° to 1000° C. to create the thermal oxide layer 15. The thickness of this layer is about 400 Å. At the same time a gate oxide layer for peripheral transistors may be formed. A layer of polycrystalline silicon is next deposited over the slice then masked for photoresist and etched to leave the interconnecting lines and gates for peripheral transistors. No polysilicon is used in the cell array. It is noted that peripheral transistors may be formed using the original substrate 14 as the channel, and also using the epitaxial layer 11 as the channel area.

The metal contacts and interconnections are made in the usual manner by depositing a thin film of aluminum over the entire top surface of the slice then patterning it by a photoresist mask and etch sequence. This leaves the metal strips 16 which function as the address lines as seen in FIGS. 1 and 3.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore contemplated that the appended claims will cover any such modifications or embodiments as fall within the true scope of the invention.

What is claimed:

1. A memory cell comprising a first thin region of one conductivity type adjacent a face of a body of semiconductor material, a second thin region of opposite conductivity type immediately underlying said first region, the first and second regions being of substantial area to provide a capacitor for storage of charge in the memory cell, a third region of said opposite type adjacent said second region and more heavily doped than said second region, the third region being contiguous to a part of the first region, elongated conductive means for making ohmic electrical connection to the third region thereby providing an input and output for data to be stored in or recalled from the cell, a substrate including a fourth region of said one type underlying said second and third regions and much thicker than said second and third regions and a conductive strip on said face over said first region insulated therefrom by a thin insulating coating, the conductive strip functioning as an address line to activate access to the capacitor of the cell via said third region.

2. A device according to claim 1 wherein the first region is an epitaxial layer overlying the second and third regions.

3. A device according to claim 2 wherein the conductive strip is metal and crosses over the third region, the third region being elongated and extending beyond edges of the second region, the conductive strip being generally perpendicular to the third region.

4. A device according to claim 3 wherein the second and third regions are surrounded on said face by field oxide much thicker than the first region.

5. A device according to claim 4 wherein the insulating coating is much thinner than the first region, whereby voltage on the conductive strip substantially determines the depletion condition of carriers in the first region.

6. A method of making a memory cell in a cell area at a face of a semiconductor body, a capacitor area being included within the cell area, comprising the steps of forming a heavily doped region of one type in a part of said cell area on said face, the semiconductor body being of the opposite type, depositing a thin layer of epitaxial semiconductor material of said opposite type on said capacitor area of the cell area of said face to provide part of a capacitor, forming a thin insulating coating over said layer, and depositing a conductive strip over said insulating coating.

7. A method according to claim 6 including the step of forming a thin lightly doped surface region of said one type on said cell area by ion implant.

8. A method according to claim 7 wherein the semiconductor body is silicon, said one type is N-type, said opposite type is P-type, and said conductive strip is metal.

9. A semiconductor memory cell comprising a single combined storage capacitor and access transistor structure in an area of a face of a semiconductor body, the cell including a heavily-doped bit line of one type in a part of said area on said face, the semiconductor body being of the opposite type, a thin lightly-doped layer of said opposite type over said area and functioning as a charge storage region of said storage capacitor, and a conductive strip over said area separated from the lightly-doped layer by a thin dielectric coating, volatage applied to the conductive strip controlling transfer of charge from said bit line to said charge storage region of said lightly-doped layer.

* * * * *